United States Patent [19]

Praeg

[11] Patent Number: 4,590,423
[45] Date of Patent: May 20, 1986

[54] COAXIAL TEST FIXTURE

[75] Inventor: Walter F. Praeg, Palos Park, Ill.

[73] Assignee: The United States of America as represented by the United States Department of Energy, Washington, D.C.

[21] Appl. No.: 595,014

[22] Filed: Mar. 30, 1984

[51] Int. Cl.[4] .................. G01R 31/00; G01R 27/00
[52] U.S. Cl. ................................ 324/158 F; 324/62; 324/421
[58] Field of Search ............... 324/158 F, 415, 421, 324/424, 62, 158 R; 339/117 R, 117 P

[56] References Cited

U.S. PATENT DOCUMENTS

| | | | |
|---|---|---|---|
| 3,925,722 | 12/1975 | Fohrhaltz et al. | 324/415 |
| 4,023,102 | 5/1977 | Barrow et al. | 324/62 |
| 4,115,736 | 9/1978 | Tracy | 324/158 F |

Primary Examiner—Ernest F. Karlsen
Attorney, Agent, or Firm—Bruce R. Mansfield; Robert J. Fisher; Judson R. Hightower

[57] ABSTRACT

An assembly is provided for testing one or more contact material samples in a vacuum environment. The samples are positioned as an inner conductive cylinder assembly which is mounted for reciprocal vertical motion as well as deflection from a vertical axis. An outer conductive cylinder is coaxially positioned around the inner cylinder and test specimen to provide a vacuum enclosure therefor. A power source needed to drive test currents through the test specimens is connected to the bottom of each conductive cylinder, through two specially formed conductive plates. The plates are similar in form, having a plurality of equal resistance current paths connecting the power source to a central connecting ring. The connecting rings are secured to the bottom of the inner conductive assembly and the outer cylinder, respectively. A hydraulic actuator is also connected to the bottom of the inner conductor assembly to adjust the pressure applied to the test specimens during testing. The test assembly controls magnetic forces such that the current distribution through the test samples is symmetrical and that contact pressure is not reduced or otherwise disturbed.

18 Claims, 4 Drawing Figures

COAXIAL TEST FIXTURE

CONTRACTUAL ORIGIN OF THE INVENTION

The United States Government has rights in this invention pursuant to Contract No. W-31-109-ENG-38 between the U.S. Department of Energy and Argonne National Laboratory.

BACKGROUND OF THE INVENTION

This invention pertains to arrangements for performing electrical tests on contact material samples, and in particular for testing contact material test samples in an evacuated environment under high current loads. Frequently, it is desirable in developing high-current separable contact material, to have at least a preliminary analysis of selected candidate conductor materials. Testing of material samples will hopefully identify materials unsuitable for high current electrical contact without requiring incorporation of the materials into a completed and oftentimes complex structure.

An example of a project requiring preliminary testing of contact materials is that of determining segmented first wall connectors on fusion devices, particularly Tokamaks. Current Tokamak designs require easily separable connectors between first wall segments, that can handle the large currents required for plasma confinement. Generally, the amount of current that connectors can safely carry depends on physical characteristics of the connector arrangement. Important characteristics include the size of the connectors, the force with which they are pressed together, and their inherent physical properties such as conductivity, melting point, and oxidation resistance. The choice of successful candidate materials also depends on the nature of the applied current, particularly the wave-form shape, pulse ramp-up-time or rise time of the current.

Some material samples, such as the aforementioned Tokamak connectors, operate in a high vacuum environment. An accurate materials test for such samples must therefore be provided in a similar vacuum, since contact performance depends on the presence or absence of various components found in an ambient air environment. For example, oxidation rate and carbon formation will differ greatly between evacuated and ambient environments.

Prior art test arrangements were designed as an electrical test apparatus which did not incorporate a vacuum system. These arrangements were designed to be placed in an evacuated chamber (when such was required), and the electrical power test connections as well as the instrumentation connections had to penetrate the vacuum vessel barrier.

Circuits containing high currents experience correspondingly high magnetic forces. It is imperative that a controlled contact pressure with the material sample be maintained during current tests. This is especially important when high test currents are employed, since the magnetic forces can tend to separate a material sample from its test assembly contacts, thereby causing an erroneous impression of the material samples current handling performance. If an accurate test of the current handling ability of material samples, particularly reduced size samples is to be obtained, any pulsed or alternating test currents must flow symmetrically through the sample.

It is therefore an object of the present invention to provide a test assembly suitable for performing high-current tests on samples efficiently and with a minimum of preparation.

Another object of the present invention is to provide an assembly for testing the maximum current density and pulse that a material sample can absorb without sticking, welding, melting, or jumping apart.

A further object of the present invention therefore is to provide a materials test assembly that can easily accommodate material samples of different sizes and surface properties, while providing a simple and accurate control over the pressure applied to the samples.

Another object of the present invention to provide an evacuated test assembly to simulate a high vacuum environment.

A related object of the present invention is to provide an evacuated test assembly having vacuum-vessel-compatible power feed, vacuum system and instrumentation connections, in which rapid and simple exchange of test samples within the vacuum environment is possible.

An additional object of the present invention is to provide a test arrangement that eliminates the vacuum interface connection of these power circuits.

Yet another object of the present invention to provide a test assembly in which a controlled pressure on material samples is maintained, despite magnetic forces impressed upon system members by reason of the test currents.

A further object of the present invention to provide a test assembly in which test currents are distributed symmetrically throughout the material sample.

Another object of the present invention to provide a compact test assembly arrangement comprised of a minimum number of inexpensive parts and which affords as high a degree of portability as is practicable.

SUMMARY OF THE INVENTION

These and another objects of the present invention are provided in a self-contained test fixture assembly which tests the response of a material sample to a high current flowing therethrough. The material sample to be tested is placed between top and bottom contacts to form an inner cylindrical conductor assembly. A cylindrical outer conductor surrounds the inner assembly, forming an arrangement of coaxial cylindrical conductors. The region between outer conductor and inner assembly is evacuated, so as to provide a self-contained evacuated environment for the material samples. The bottom contact is resiliently mounted and connected to a hydraulic actuating system for controlling pressure applied by the bottom contact to the material sample. Resilient mounting of the bottom inner contact allows regulation of the direction, as well as the magnitude of the compressive force applied to the material sample. A bellows is employed to maintain a vacuum seal around the bottom contact. Located near the bottom of the assembly are top and bottom annular electrode plates which apply current feed to the outer conductor and inner conductor assemblies, respectively. Each electrode plate employs six distribution leads of equal resistance, to ensure symmetrical current distribution throughout the material sample.

BRIEF DESCRIPTION OF THE DRAWINGS

In the drawings, wherein like elements are referenced alike.

DETAILED DESCRIPTION OF THE PREFERRED EMBODIMENT

Figure 1:
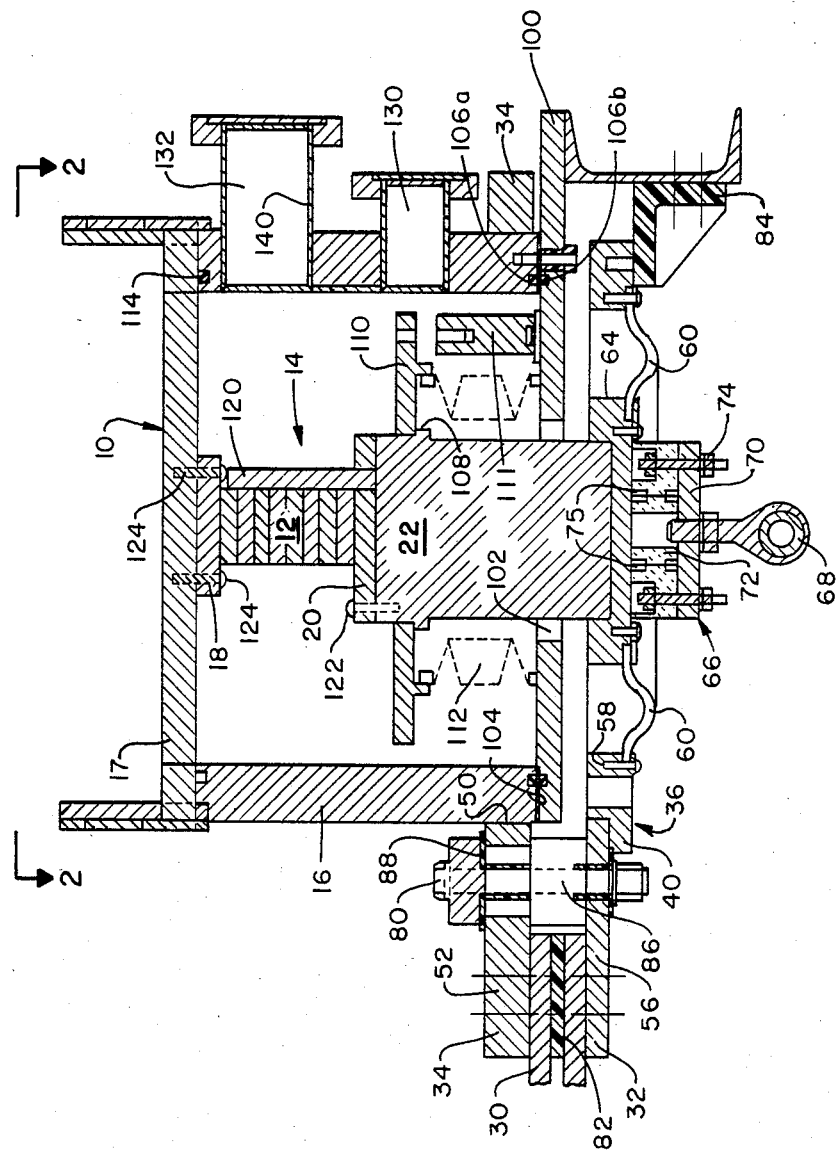
FIG. 1 is a cross-sectional elevation view of a test assembly according to the invention.
Figure 2:
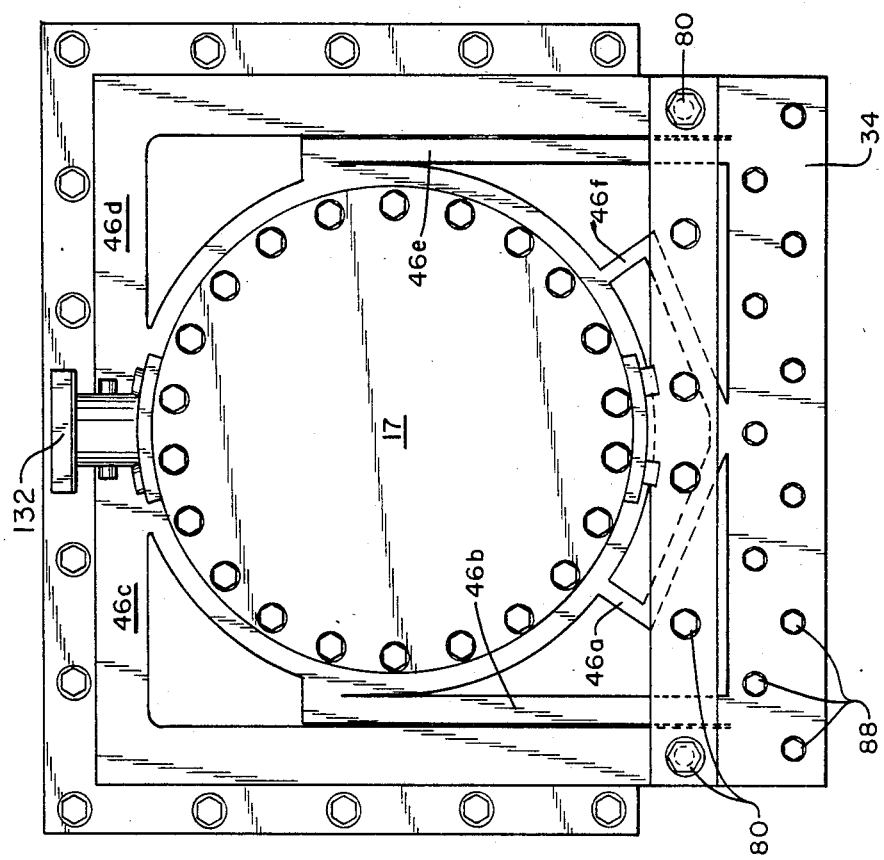
FIG. 2 is a plan view of the arrangement of FIG. 1.

Referring now to FIGS. 1 and 2, a self-contained test fixture 10 is used to analyze the response of contact material samples or test specimens 12 to high currents, in a high vacuum environment. As will be seen, fixture 10 comprises a coaxial arrangement of an inner cylinder assembly 14 and an outer cylinder 16, wherein inner cylinder assembly 14 contains one or more test specimens 12. Inner cylinder assembly 14 and outer cylinder 16 are electrically connected together at their upper ends by a conductive removable cap 17, to form a completed conductive path. Power is applied to this conductor path from lower portions of the test assembly.

Inner cylinder assembly 14 includes (in part) upper and lower contact plates 18, 20, respectively, between which test specimens 12 are positioned. A stub member 22, which supports the lower contact plate 20 and test specimens, is made of a conductive material, like copper, so as to form a portion of the current path through the test specimens. Outer cylinder 16, comprised of copper or the like conductive material, is coaxially aligned with, and surrounds inner cylinder assembly 14, forming a vacuum enclosure therefor.

Figure 3:
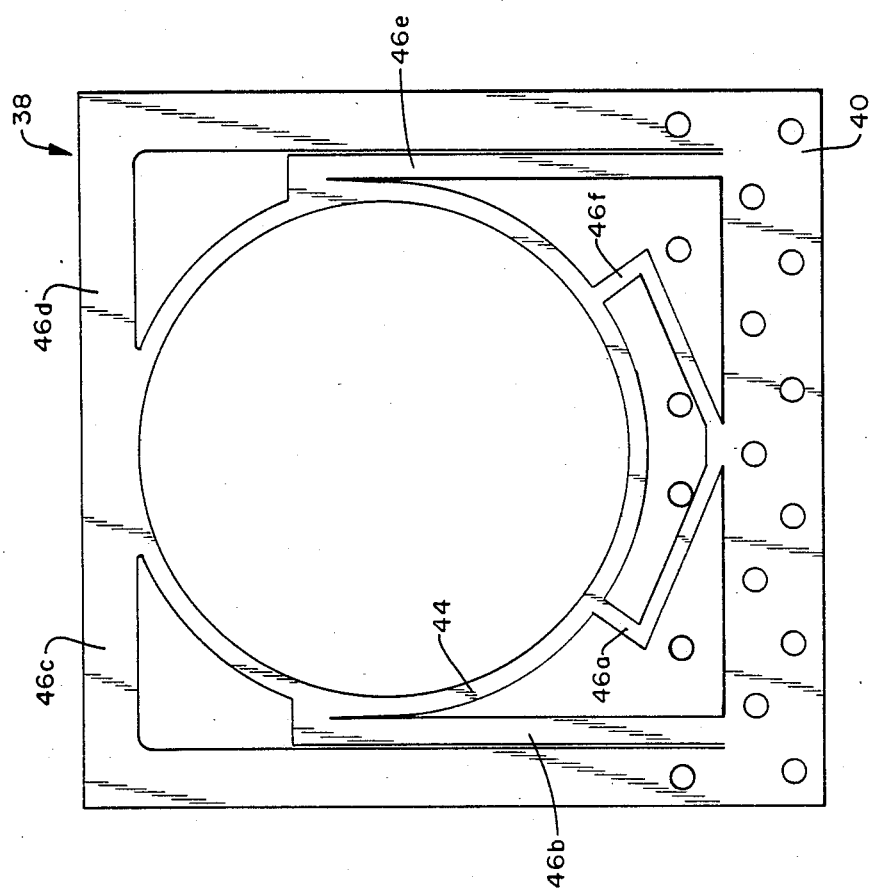
FIG. 3 shows a typical electrode connecting member utilized in the arrangement of FIGS. 1 and 2.

As will now be explained, power is applied to inner and outer conductive paths from bottom portions of the test assembly. Two strip-lines or copper buss-bar like structures 30, 32 provide interconnection between the test assembly and a source of power needed for driving the test current through the material samples. The upper strip-line 30 is connected to the lower end of outer cylinder 16 through an upper electrode assembly 34. The lower strip-line 32 is connected to the lower end of inner conductive assembly 14 through a lower electrode assembly 36. A typical electrode assembly 38, shown in FIG. 3, will be used to describe the construction of both upper and lower electrode assemblies 34, 36, which, except for minor design details, are identical thereto. Assembly 38, formed of a conductor material such as copper, provides electrical connection between a strip line and a circuit component, preferably one having a cylindrical outer contact surface. In the preferred embodiment, assembly 38 provides electrical connection between pad 40 and ring 44 through a plurality of equal resistance connecting links 46. In the arrangement of FIG. 3 (and also in electrodes 34, 36) six links 46a–46f, all of equal resistance, are employed to provide uniform current distribution around ring 44. Equal resistance is provided by increasing the cross-sectional area of longer links.

Referring again to FIG. 1, the ring portion 50 of upper electrode 34 engages the outer bottom surface of outer cylinder 16 and is electrically bonded thereto by brazing or the like joining method. The pad portion 52 of upper electrode 34 contacts upper strip-line 30.

Figure 4:
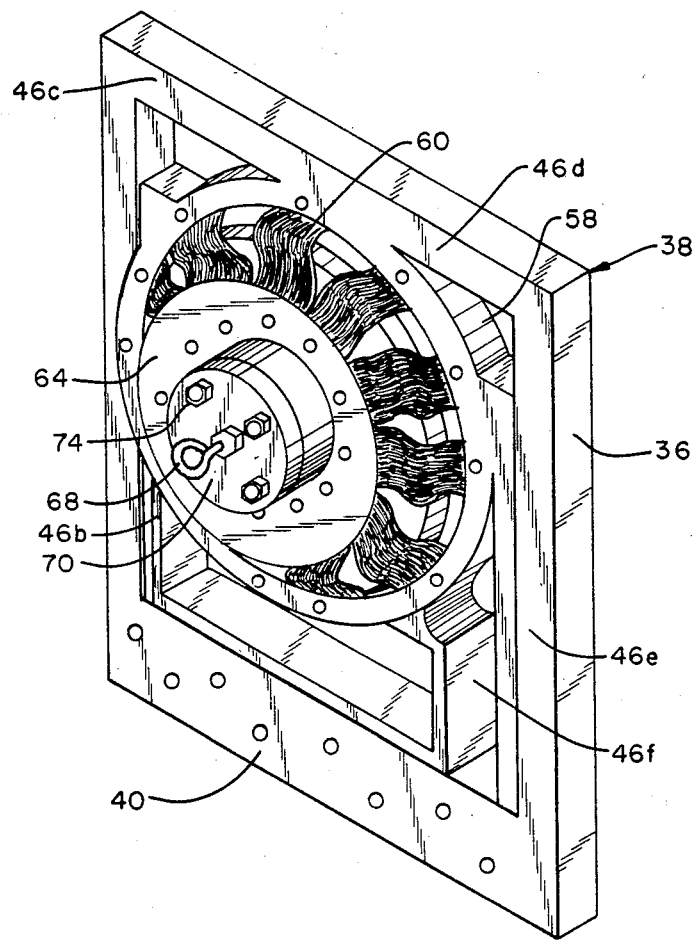
FIG. 4 is a partial perspective view the lower central portion of the arrangement of FIGS. 1 an 2.

Referring now to FIGS. 1 and 4, lower electrode 36 has a pad portion 54 which contacts conductive strip 56, which in turn, contacts lower strip-line 32. Conductor strip 56, was provided for ease of fabrication, but may be integrally formed with pad 54 if so desired. The inner ring 58 of lower electrode 36 provides connection between strip-line 32 and the lower end of inner cylinder assembly 14. Unlike upper electrode 34, ring 58 does not contact assembly 14 directly, since that assembly is mounted for vertical reciprocal motion as well as tilting about its vertical axis. Hence, a plurality of flexible conductor strips 60 are employed to complete the electrical connection to inner assembly 14. In the preferred embodiment, ten conductive strips are employed to insure uniform current distribution around the lower end of assembly 14.

Connection to inner conductor assembly 14 can be made directly to the lower end of stub 22. However, in the preferred embodiment, a cap assembly 64 provides mechanical and electrical attachment to stub 22. As can be seen in FIG. 1, conductive straps 60 are secured to the outer periphery of cap assembly 64 for electrical connection. Provided as a part of cap assembly 64 is a mechanical loading connection 66, which comprises an eye-bolt 68, disk 70, and an insulator ring 72. Disk 70 is secured to insulator ring 72 by a plurality of bolts 74. Insulating ring 72 is secured, in turn, to cap 64 by a plurality of bolts 75. An eye-bolt 68, which is electrically insulated from cap 64 by insulating ring 72, is used as a convenient point of attachment to a mechanical actuator system which displaces inner conductor assembly 14, so as to exert a range of positive and negative pressures on contact material samples 12. In the preferred embodiment, an hydraulic piston was attached to eye-bolt 68 to adjust the pressure exerted on test specimens 12. Also, three guy wires, not shown in the figures, were attached to eye-bolt 68 to adjust the tilting of inner assembly 14 about a vertical axis, thereby assuring that the contact parallelism tolerances for the specimens is compensated, and that the force applied to the specimens remains normal to the surface of the specimens.

It is also essential for accurate analysis, that proper contact pressure on the test specimens is not disturbed by magnetic forces arising from currents flowing in the test assembly, and particularly in the material sample itself. In the arrangement of the present invention, the magnetic field produced by current flowing through the outer coaxial cylinder and inner coaxial test assembly will act upon the current itself. These magnetic forces will exert pressure on the outside of the test samples, directed radially inwardly so as to shrink them. These magnetic forces will also exert pressure on the inside of outer cylinder 16, directed radially outwardly so as to expand it. The resulting forces will keep the current distribution in the outer cylinder and inner cylinder assembly symmetrical with respect to the coaxial cylinder axis.

Referring again to FIG. 1, contact between the strip-lines 30, 32 and electrodes 34, 36 is maintained by a bolt 80. Insulating washers 86, 88 are employed with bolt 80 to afford compression of members 30, 32, 34, and 56 with the required electrical insulation. An insulating lamination 82 separates strip-lines 30, 32, while base member 84, comprised of a molded epoxy provides the remaining insulation needed to isolate upper and lower electrodes 34, 36 and their associated current carrying members.

The outer vacuum vessel enclosure of outer cylinder 16 and cap 17 is completed by lower wall member 100. An insulating air gap 102 separates stub 22 from wall 100. Wall 100 is insulated from cylinder 16 by an insulating gasket 104. In the preferred embodiment, gasket 104 comprises a 0.25 cm thick glass reinforced Teflon ring. A vacuum seal across this insulation is maintained by two resilient Viton "O" rings, 106a, 106b, positioned on either side of gasket 104. The vacuum seal between outer cylinder 16 and cap 17 is also maintained by a resilient Viton O-ring 114. It can be seen that lower wall 100 is insulated from the test stand to assure that all current flowing in the test assembly passes through the test specimens.

Stub 22 includes an annular shoulder 108 which is brazed to supporting collar 110. A welded bellows 112, attached between collar 110 and wall 100, maintains a vacuum-tight environment around the test specimens 12 as the inner cylinder assembly 14 is tilted and displaced vertically. A support post 111 limits the downward movement of collar 110 and provides securement of inner cylinder assembly 14 during transportation of the test assembly. Collar 110 and support 111 are bored to receive a close tolerance bolt (not shown in the figure) which acts as a guide pin to keep the floating inner conductor assembly 14 centered with respect to outer cylinder 16, during operation.

The preferred embodiment of the present invention was designed to hold up to eight test specimens, each 0.95 cm thick. These specimens rest on lower contact plate 20, between three Vespel guide posts 120. Different sets of contact plates and guide posts are used to accommodate samples of differing diameter size. All sizes must, however, fit within the outer cylinder, which in the preferred embodiment was 33.6 cm in diameter and 19.2 cm high. The lower adapter plate 20 is bolted to stub 22 by bolt 122, and upper adapter plate 18 is bolted to removable cap 17 by bolts 124 to provide easy exchange.

In the preferred embodiment, the test assembly is mounted on a portable test stand end together with the hydraulic loading system and vacuum system required to provide appropriate conditions for tests. The test stand is portable to permit use with power supplies that have differing capabilities. The test assembly was operated with half sine wave pulses of less than 300 thousand amperes, and was designed for carrying currents of up to 600,000 amperes for approximately 300 milliseconds at a repetition rate of one pulse every five minutes. Instrumentation is provided to measure the current pulse, contact voltage drop, contact pressure, the strain caused by contact pressure, and the operating temperature of the material samples.

Two vacuum feedthroughs 130, 132 are installed in outer cylinder 16 for the vacuum system and the instrumentation connections, respectively. During testing, the assembly of the present invention was operated at vacuum pressures as low as $2 \times 10^{-2}$ Pa. All instrumentation installed within the test chamber is brought out to a hermetically sealed 37 pin connector. The connector is mounted at the outside end of a tube 140 which extends through outer cylinder 16 as shown in FIG. 1. This design locates the connector outside of the current carrying wall. Taken together with the use of twisted leads and shielded cable, this design nearly eliminates the influence of internal magnetic field noise on the instrumentation signal.

Each specimen stack is instrumented with voltage taps across the contact surface for each pair of specimens. A chromel alumel thermocouple is mounted halfway between the contact surfaces in the side of one specimen of each pair, and strain gauges read the strain caused by the contact pressure. A small Rogowski belt is placed around the top specimen in the stack to measure current through the stack.

Specimen strain is monitored by three arrays of strain gauges mounted on the periphery of a 1.9 cm thick copper slug, placed at the bottom of the specimen stack. The strain gauge arrays are separated at 120° angles around the copper slug periphery. Each strain gauge array is made up of two 90° gauge rosettes wired as a half Weatstone bridge for maximum sensitivity. Each specimen stack is wired and calibrated as a unit with the wires connected in a female coupling of the 37 pin connector. This unit is installed and connected by shielded cables to the readout instruments. The contact voltage drop and current readings are taken during each pulse by taking oscilloscope pictures. All other data is taken before and after each pulse.

In the preferred embodiment, contact pressure on the specimens 12 is adjustable from near zero to a maximum pressure of 2.07 MPa. These pressures are attained by use of an hydraulic system which is connected to eye-bolt 68. For contact pressures less than approximately 1.38 MPa, a downward or negative compression load must be applied to eye-bolt 68 to overcome air pressure on the floating stub. Above these pressures, an upward or positive load is required. The hydraulic loading system consists, therefore, of a double acting cylinder operated by a hand hydraulic pump with valving that provides for application of the loads in either direction. A bleed valve for fine adjustment of the loading pressure is also provided. The pressure adjustment is roughly made by use of a standard 0-1500 psi hydraulic pressure gauge in a 454 kg rated capacity load cell. The load cell is mounted between the hydraulic cylinder and eye-bolt 68. The final adjustment utilizes strain gauges mounted on the specimen stack. Directional adjustment of the pressure applied to the specimen stack is accomplished by a lateral motion of the bottom of floating stub 22. The top of the stub is held in place by the aforementioned close-tolerance guide pins which allow vertical motion while preventing lateral motion. A set of three turn buckles (not shown in the figures) is used to provide the lateral deflection of floating stub 22. These turn buckles are mounted at 120° angles around inner cylindrical assembly 14 to bolts 74, and are attached at their other end to the test stand. These turn buckles exerting forces normal to the load axis of the stub and the load cell. Turn buckles are required because current capacity requirements necessitate the use of a large copper cross section in the flexible straps 60 which makes them quite stiff; therefore, a moderately large force is required to deflect the inner cylinder assembly 14.

It can be seen that test assembly of the present invention provides a compact portable self-contained vacuum chamber with non-disruptive, stable magnetic forces and azimuthally symmetrical current distribution. Compressive loadings applied to the test specimens are variable in both magnitude and direction. The test assembly can be operated at high vacuum and temperature levels needed to simulate fusion containment environments.

The embodiments of the invention in which an exlusive property or privilege is claimed are defined as follows:

1. A test fixture for subjecting a test specimen having first and second ends with contact surfaces on each end, to a test current flowing therethrough, comprising:
    an electrically conductive generally cylindrical vacuum enclosure having a first closed end with a first contact surface, and a second end;
    a generally cylindrical inner conductor assembly concentrically disposed within said vacuum enclosure, including a first end with a second contact surface which is spaced apart from said first contact surface to form a gap for receiving said test specimen therebetween, said inner conductor assembly further including a second end;

a load connection means for applying a pressure force to said second end of said inner conductor assembly, said pressure force being transmitted to said second contact surface of said inner conductor assembly, said test specimen, and said first contact surface, to hold said test specimen in a fixed position between said first and said second contact surfaces, with a predetermined contact pressure;

first and second connection means for connecting said second ends of said inner conductor assembly and said vacuum enclosure, respectively, to an external test current source, such that said test current is driven through said first and said second contacts and said test specimen;

said cylindrical vacuum enclosure providing a return current path for test currents driven through said inner conductor assembly and said test specimen by said external test current source;

said test specimen disposed within said vacuum enclosure such that a vacuum environment is provided for said test specimen during said testing, and magnetic forces created by said test current flowing through said test specimen are prevented from altering said predetermined contact pressure.

2. The arrangement of claim 1 wherein said second vacuum enclosure end includes an end wall having an aperture for receiving said inner conductor assembly, and said inner conductor assembly protrudes at least partially beyond said vacuum enclosure.

3. The arrangement of claim 2 wherein said inner conductor assembly is mounted for reciprocal motion in a vertical direction, and for tilting motion about a vertical axis.

4. The arrangement of claim 3 wherein said second connection means comprises a generally flat plate having a ring for receiving portions of said vacuum enclosure adjacent said second end thereof so as to be in electrical contact therewith, said second connection means further comprising a plurality of equal resistance connecting links connected between said ring and said external current source.

5. The arrangement of claim 4 wherein said first connection means comprises a generally planar arrangement of a conductive ring for receiving said second end of said inner conductor assembly, and a plurality of equal resistance connecting links connecting said ring to said external current source;

6. The arrangement of claim 5 wherein said ring of said first connection means is dimensioned larger than said second end of said inner conductor assembly, so as to be spaced apart therefrom, and said first connection means further comprises a plurality of flexible conductive straps connecting said ring to said second end of said inner conductor assembly.

7. The arrangement of claim 3 wherein said load connection means comprises an eye-bolt connected to said second end of said inner conductor assembly through an insulating spacer member.

8. The arrangement of claim 7 further comprising a vacuum sealing bellows disposed between said inner conductor assembly and said second wall of said outer cylindrical vacuum enclosure.

9. The arrangement of claim 8 further comprising a plurality of vertically-oriented guide posts having first and second free ends, and connected at their second ends to said inner cylindrical conductor assembly, said guide posts surrounding said specimen so as to orient said specimen relative to said first and said second contact surfaces.

10. The arrangement of claim 9 wherein said first end of said cylindrical vacuum enclosure comprises a removable cap member separably connected to said cylindrical vacuum enclosure.

11. A test fixture assembly for subjecting a test specimen having first and second ends with contact surfaces on each end, to a test current flowing therethrough, comprising:

an electrically conductive generally cylindrical vacuum enclosure having a first closed end with a first contact surface, and a second end with a central aperture located therein;

a generally cylindrical inner conductor assembly concentrically disposed within said vacuum enclosure, having a first end with a second contact surface, and a second end, said inner conductor assembly disposed in said aperture with said second end of said inner conductor assembly protruding beyond said vacuum enclosure;

load connection means attached to said second end of said inner conductor assembly to receive a pressure loading force;

mounting means for mounting said inner conductor assembly for reciprocal vertical movement and for tilting about a vertical axis;

said first and said second contact surfaces spaced apart from each other to receive said test specimen therebetween, with said inner conductor assembly transmitting said pressure loading force to said test specimen and said first and said second contact surfaces, so as to maintain a predetermined contact pressure between said first and said second contact surfaces and said test specimen during the application of said test current therethrough;

resilient vacuum sealing means connected between said inner conductor assembly and said vacuum enclosure second end to maintain a vacuum-tight seal during application of said pressure loading force to said inner conductor assembly, said vacuum sealing means cooperating with said vacuum enclosure to maintain a vacuum environment around said test sample during application of said test current therethrough;

first electrical connection means for connecting said vacuum enclosure to an electrical source of said test current;

second electrical connection means for connecting said second end of said inner conductor to said electrical source of said test current, such that said test current is driven through said first and said second contacts and said test specimen; and said test specimen is disposed within said vacuum enclosure such that a vacuum environment is provided for said test specimen during said testing, and magnetic forces created by said test current flowing through said test specimen are prevented from altering said predetermined contact pressure.

12. The arrangement of claim 11 further including a mounting ring disposed about said inner conductor, adjacent said first end thereof, and said resilient vacuum sealing means comprises a bellows connected at first and second ends to said mounting ring and said second end of said vacuum enclosure, respectively.

13. The arrangement of claim 12 wherein said second connection means comprises a generally flat plate having a ring for receiving portions of said vacuum enclosure adjacent said second end thereof so as to be in electrical contact therewith, said second electrical connection means further comprising a plurality of equal resistance connecting links connected between said ring and said external current source.

14. The arrangement of claim 13 wherein said first electrical connection means comprises a generally planar arrangement of a ring for receiving said second end of said inner conductor assembly, and a plurality of equal resistance connecting links connecting said ring to said external current source.

15. The arrangement of claim 14 wherein said ring of said first electrical connection means is dimensioned larger than said second end of said inner conductor assembly, so as to be spaced apart therefrom, said first connecting means further comprising a plurality of flexible conductive straps connecting said ring to said second end of said inner conductor assembly.

16. The arrangement of claim 15 wherein said load connection means comprises an eye-bolt connected to said second end of said inner conductor assembly through an insulating spacer member.

17. The arrangement of claim 16 further comprising a plurality of vertically-oriented guide posts having first and second free ends, and connected at their second ends to said inner conductor assembly, said guide posts surrounding said specimen so as to orient said specimen relative to said first and said second contact surfaces.

18. The arrangement of claim 17 wherein said first end of said cylindrical vacuum enclosure comprises a cap member separably connected to said cylindrical vacuum enclosure.

* * * * *